United States Patent
Ahn et al.

(10) Patent No.: US 12,411,175 B2
(45) Date of Patent: Sep. 9, 2025

(54) INTEGRATED CIRCUIT PACKAGE FOR SCAN TESTING SEMICONDUCTOR CHIP, OPERATING METHOD OF INTEGRATED CIRCUIT PACKAGE, AND INTEGRATED CIRCUIT

(71) Applicant: Samsung Electronics Co., Ltd., Suwon-si (KR)

(72) Inventors: Taewoong Ahn, Suwon-si (KR); Youngin Park, Suwon-si (KR); Junyeong Jang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 6 days.

(21) Appl. No.: 18/450,043

(22) Filed: Aug. 15, 2023

(65) Prior Publication Data

US 2024/0061040 A1    Feb. 22, 2024

(30) Foreign Application Priority Data

Aug. 17, 2022   (KR) ........................ 10-2022-0102950

(51) Int. Cl.
     *G01R 31/3185*     (2006.01)
(52) U.S. Cl.
     CPC ............ *G01R 31/318536* (2013.01); *G01R 31/318547* (2013.01)
(58) Field of Classification Search
     CPC ............ G01R 31/318536; G01R 31/318547
     See application file for complete search history.

(56) References Cited

U.S. PATENT DOCUMENTS

| | | |
|---|---|---|
| 7,512,851 B2 | 3/2009 | Wang et al. |
| 7,890,823 B2 | 2/2011 | Anzou |
| 8,205,125 B2 | 6/2012 | Hales et al. |
| 8,539,293 B2 | 9/2013 | Lee et al. |
| 8,650,524 B1 | 2/2014 | Chakravadhanula et al. |
| 8,904,256 B1 | 12/2014 | Chakravadhanula et al. |
| 9,157,961 B2 | 10/2015 | Wohl et al. |

(Continued)

FOREIGN PATENT DOCUMENTS

| | | |
|---|---|---|
| JP | 4520103 B2 | 8/2010 |
| KR | 101709071 B1 | 2/2017 |

OTHER PUBLICATIONS

Search Report for European Application No. 23191613.1 dated May 27, 2024.

(Continued)

*Primary Examiner* — Albert Decady
*Assistant Examiner* — Osman M Alshack
(74) *Attorney, Agent, or Firm* — Harness, Dickey & Pierce, P.L.C.

(57) ABSTRACT

An integrated circuit package for scan testing a semiconductor chip includes at least one first input pad configured to receive a first input signal, at least one chip connected to the first input pad, and at least one first output pad configured to receive a first output signal generated by the at least one chip, wherein each of the at least one chip includes at least one second input pad configured to receive a second input signal, a plurality of scan chains, a first test circuit and a second test circuit, which share the plurality of scan chains, and at least one second output pad configured to receive a second output signal from the first test circuit.

19 Claims, 11 Drawing Sheets

(56) References Cited

U.S. PATENT DOCUMENTS

| | | |
|---|---|---|
| 9,459,319 B2 | 10/2016 | Chen et al. |
| 10,921,371 B2 | 2/2021 | Shah et al. |
| 2007/0283200 A1* | 12/2007 | Casarsa .......... G01R 31/318547 714/724 |
| 2011/0099442 A1 | 4/2011 | Hales et al. |
| 2015/0095729 A1 | 4/2015 | Goel et al. |
| 2016/0109514 A1* | 4/2016 | Jindal ............ G01R 31/318572 714/727 |
| 2016/0266202 A1* | 9/2016 | Mittal ................ G01R 31/2851 |
| 2017/0184665 A1 | 6/2017 | Tiwari et al. |
| 2020/0355744 A1 | 11/2020 | Narayanan et al. |

OTHER PUBLICATIONS

Partial European Search Report dated Jan. 22, 2024 issued in corresponding European Appln. No. 23191613.1.

* cited by examiner

INTEGRATED CIRCUIT PACKAGE FOR SCAN TESTING SEMICONDUCTOR CHIP, OPERATING METHOD OF INTEGRATED CIRCUIT PACKAGE, AND INTEGRATED CIRCUIT

CROSS-REFERENCE TO RELATED APPLICATION

This application is based on and claims priority under 35 U.S.C. § 119 to Korean Patent Application No. 10-2022-0102950, filed on Aug. 17, 2022, in the Korean Intellectual Property Office, the disclosure of which is incorporated by reference herein in its entirety.

BACKGROUND

The inventive concepts relate to an integrated circuit package for scan testing semiconductor chips, an operating method of the integrated circuit package, and an integrated circuit, and for example, to an integrated circuit package that performs semiconductor package testing and electric die sorting (EDS) testing on a plurality of test circuits sharing a scan chain.

Methods using scan test for efficient testing of integrated circuits (ICs) are widely used. A scan test is a method of testing a typical flip-flop by replacing the typical flip-flop with a scan flip-flop and configuring the scan flip-flop into one or more shift scan chains.

A test pad that receives a signal for determining whether a semiconductor chip is defective may be ball-out to a single-chip. The ball-out means that the pad is exposed to the outside of a circuit to receive signals.

However, it may be physically limited to expose all test pads of chips to the outside in a multi-chip package. Accordingly, when a defective chip is included in a multi-chip package, there may be a problem that a test device cannot be connected to the pad exposed to the outside, so it may be necessary to separate each semiconductor chip and inspect the semiconductor chip for defects.

SUMMARY

The inventive concepts provide an integrated circuit package that can test semiconductor chips for defects even in a multi-chip package state using two test circuits sharing a scan chain and perform both an electric die sorting (EDS) test and a package test.

According to an aspect of the inventive concepts, there is provided an integrated circuit package for scan testing a semiconductor chip including at least one first input pad configured to receive a first input signal, at least one chip connected to the first input pad, and at least one first output pad configured to receive a first output signal generated by the at least one chip, wherein each of the at least one chip includes at least one second input pad configured to receive a second input signal, a plurality of scan chains, a first test circuit and a second test circuit, which share the plurality of scan chains, and at least one second output pad configured to receive a second output signal from the first test circuit, wherein the integrated circuit package includes a signal selection circuit configured to receive a selection signal and determine whether the first input signal is used in the first test circuit or the second test circuit based on the selection signal.

According to another aspect of the inventive concepts, there is provided an operating method of an integrated circuit package for scan testing a semiconductor chip including receiving a first input signal through a first input pad, receiving a selection signal by a selection signal circuit, determining, based on the selection signal, whether the first input signal is provided to one of a first test circuit and a second test circuit of at least one chip exposed to the semiconductor chip, and outputting a first output signal generated by the first test circuit or a second output signal generated by the second test circuit, wherein the outputting the first output signal or the second output signal includes, when the first input signal is input to the first test circuit, outputting the first output signal to a first output pad exposed to the outside of the semiconductor chip.

According to another aspect of the inventive concepts, there is provided an integrated circuit for scan testing a semiconductor chip including a first test circuit configured to receive one of a first input signal and a second output signal, and generate a first output signal, a second test circuit configured to receive a first input signal and generate a second output signal, wherein the first test circuit includes a first decompressor configured to receive the first input signal or the second input signal, a first compressor configured to generate the first output signal, and a scan chain configured to connect the first decompressor with the first compressor, and the second test circuit includes a second decompressor configured to receive the first input signal, a second compressor configured to generate a second output signal, and the scan chain configured to connect the second decompressor with the second compressor, wherein the first test circuit and the second test circuit are configured to share the scan chain.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Terms used in the present disclosure will be briefly described and example embodiments will be described in detail.

Figure 1:
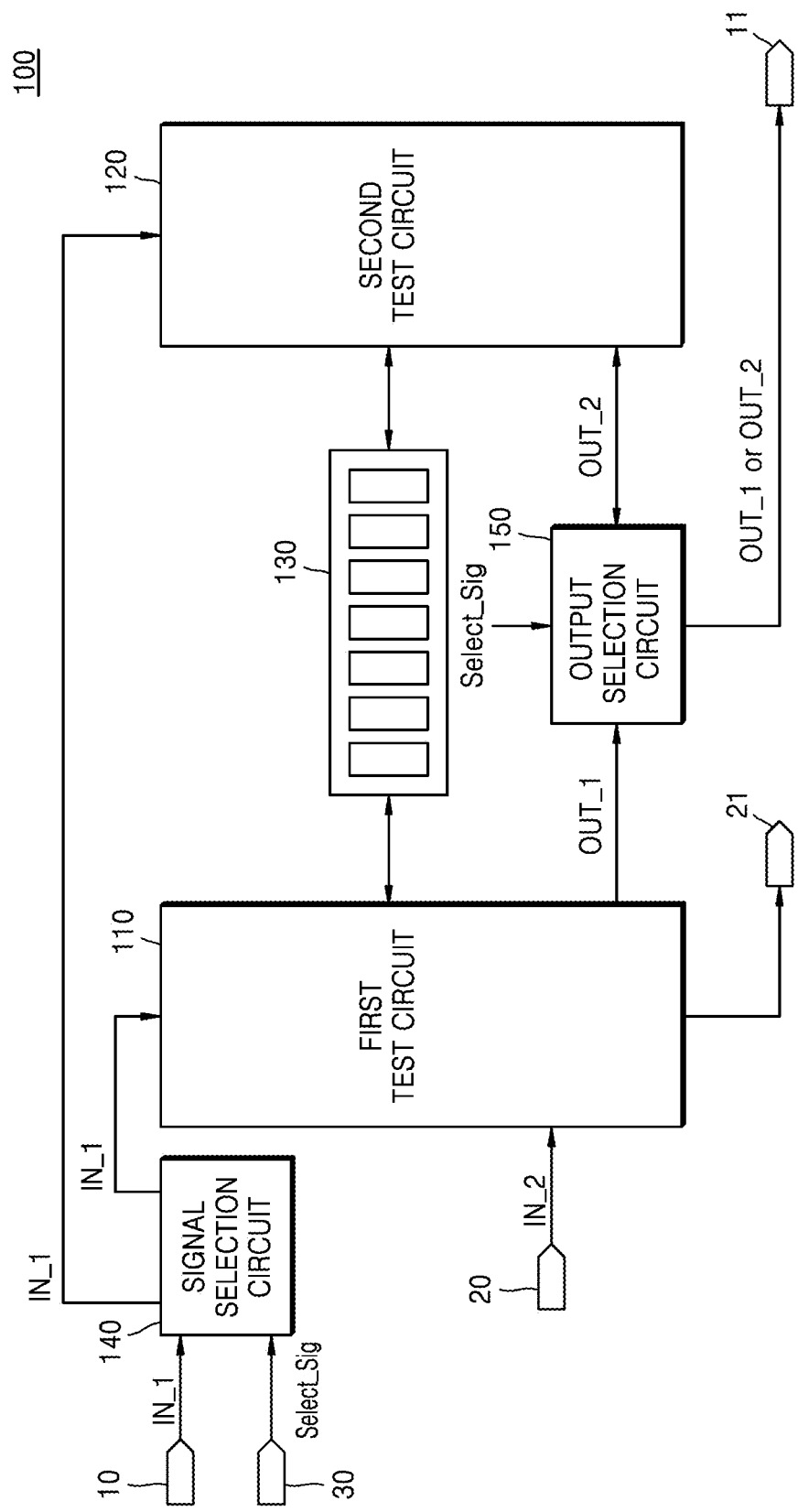
FIG. 1 is a block diagram of an integrated circuit package according to example embodiments.

FIG. 1 is a block diagram of an integrated circuit package 100 according to example embodiments.

Referring to FIG. 1, the integrated circuit package 100 according to example embodiments may include a first test circuit 110, a second test circuit 120, and/or a scan chain block 130 shared by the first test circuit 110 and the second test circuit 120. In addition, the integrated circuit package 100 may further include a signal selection circuit 140 and/or an output selection circuit 150 and may include a first input pad 10 that receives a first input signal IN_1, a first output pad 11 that outputs a first output signal OUT_1, a second input pad 20 that receives a second input signal IN_2, a second output pad 21 that receives a second output signal OUT_2, and a third input pad 30 that receives a selection signal Select_Sig.

The first input pad 10 may receive the first input signal IN_1. The first input pad 10 may be physically exposed to the outside of the integrated circuit package 100. The first input signal IN_1 may be a signal for package testing, the first input pad 10 may be connected to the signal selection circuit 140, and the first input signal IN_1 may be provided to the first test circuit 110 and the second test circuit 120 through the selection signal circuit 140.

The second input pad 20 may receive the second input signal IN_2 The second input pad 20 may be physically exposed to the outside of the first test circuit 110 in the inside of the integrated circuit package 100. The second input signal IN_2 may be a signal for electric die sorting (EDS) testing, and the second input pad 20 may be directly connected to the first test circuit 110 without passing through the signal selection circuit 140. In addition, a plurality of second input pads 20 may be provided.

The third input pad 30 may receive the selection signal Select_Sig. The third input pad 30 may be physically exposed to the outside of the integrated circuit package 100. The selection signal Select_Sig may have a logic value "0" or "1", a state in which the logic value is "0" may be defined as a low state, and a state in which the logic value is "1" may be defined as a high state. The selection signal Select_Sig and the first input signal IN_1 may be used to determine a test circuit to be used.

The first output pad 11 may receive the first output signal OUT_1 generated by the first test circuit 110. The first output pad 11 may be physically exposed to the outside of the integrated circuit package 100. In addition, the second output pad 21 refers to an output pad that receives the second output signal OUT_2 generated by the second test circuit 120. The second output pad 21 may be physically exposed to the outside of the first test circuit 110 in the inside of the integrated circuit package 100. According to example embodiments, a plurality of second output pads 21 may be provided.

Hereinafter, the output signal generated by the first test circuit 110 is defined as a first output signal OUT_1, and the output signal generated by the second test circuit 120 is defined as a second output signal OUT_2. According to example embodiments, the first output signal OUT_1 may include one of a package test result and an EDS test result. In addition, the second output signal OUT_2 may include a package test result.

The first test circuit 110 may be an integrated circuit for performing an EDS test and a package test on a semiconductor chip. For example, when the first input signal IN_1 is received by the first test circuit 110, the first test circuit 110 may operate in a package test mode. In addition, when the second input signal IN_2 is received by the first test circuit 110, the first test circuit 110 may operate in an EDS test mode. The operation of the first test circuit 110 will be described in detail with reference to FIGS. 2 and 3.

The second test circuit 120 may be an integrated circuit for performing a package test on a semiconductor package. For example, the second test circuit 120 may receive the first input signal IN_1 and process the first input signal IN_1 to generate the second output signal OUT_2. According to example embodiments, the second output signal OUT_2 may include information on a package test result. An operation of the second test circuit 120 will be described in detail with reference to FIG. 4.

The scan chain block 130 may include a plurality of scan chains (not shown), and each of the scan chains (not shown) may include a plurality of flip-flops FFs. In addition, the first test circuit 110 and the second test circuit 120 may share the scan chain block 130. The configuration of the scan chain block 130 will be described in detail with reference to FIG. 5.

The signal selection circuit 140 receives a first input signal IN_1 and a selection signal Select_Sig, and determines a test circuit in which the first input signal IN_1 is utilized. For example, when the logic value of the selection signal Select_Sig is in a high state and the first input signal IN_1 is received, the signal selection circuit 140 may input the first input signal IN_1 to the first test circuit 110. In addition, when the logic value of the selection signal Select_Sig is in a low state and the first input signal IN_1 is received, the signal selection circuit 140 may input the first input signal IN_1 to the second test circuit 120. That is, when the first input signal IN_1 is received, the signal selection circuit 140 may control whether the first input signal IN_1 is transmitted to the first test circuit 110 based on the logic value of the selection signal Select_Sig received from the outside.

The output selection circuit 150 receives the output signal of the first test circuit 110, the output signal of the second test circuit 120, and the selection signal Select_Sig, and determines the signal to be output to the first output pad 11. For example, when the logic value of the selection signal Select_Sig is "1", the output selection circuit 150 determines that the package test has been performed in the first test circuit 110 and transmits the first output signal OUT_1 to the first output pad 11. In addition, when the second output signal OUT_2 is input to the output selection circuit 150 and the logic value of the selection signal Select_Sig is "0", the output selection circuit 150 determines that the package test has been performed in the second test circuit 120 and transmits the second output signal OUT_2 to the second output pad 21.

Hereinafter, various operations of an integrated circuit package according to example embodiments shown in FIGS. 2 to 4 will be described.

Figure 2:
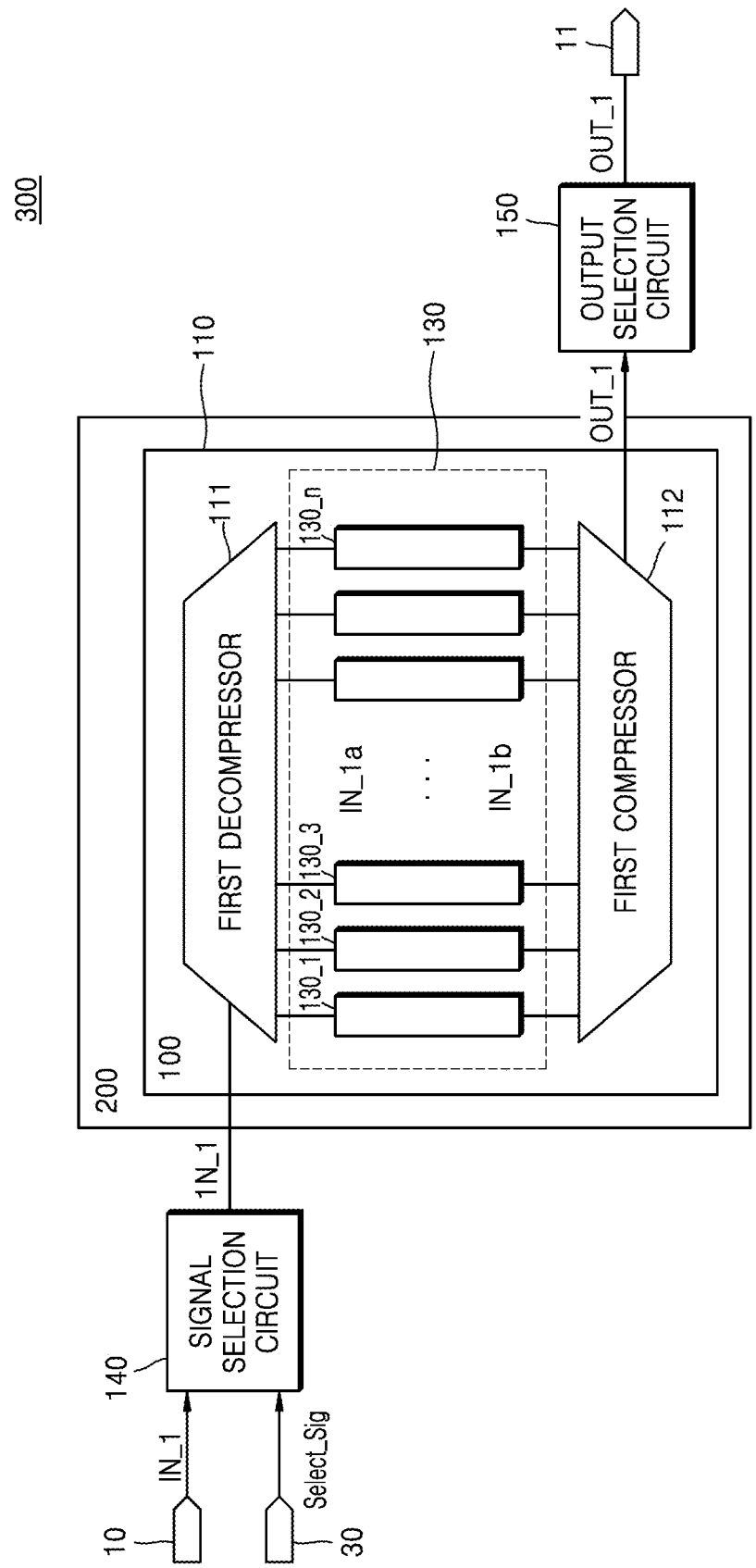
FIG. 2 is a circuit diagram when a first input signal is received in a first test circuit according to example embodiments.
Figure 3:
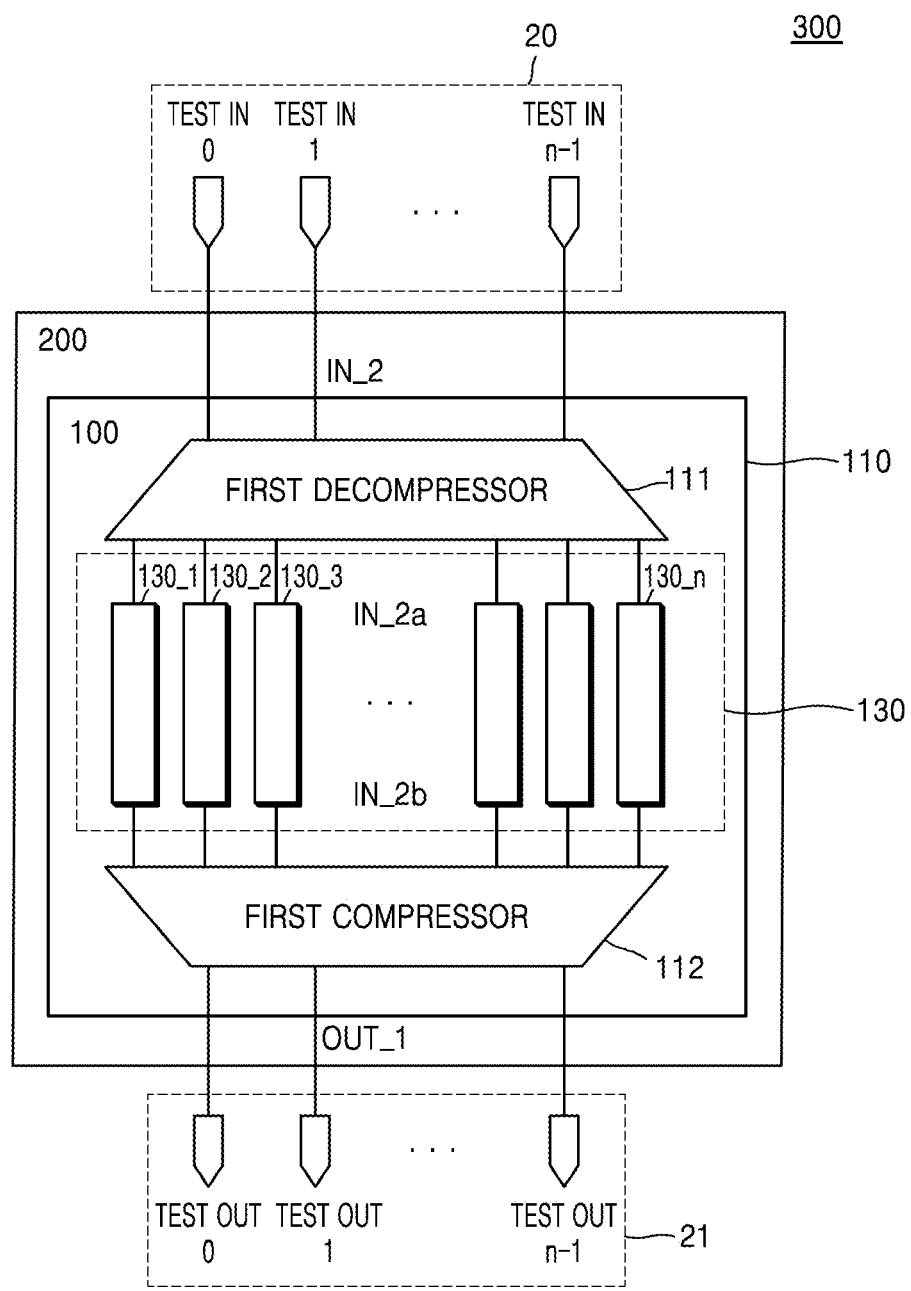
FIG. 3 is a circuit diagram when a second input signal is received in a first test circuit according to example embodiments.

FIG. 2 is a circuit diagram when a first input signal IN_1 is received in a first test circuit 110 according to example embodiments, and FIG. 3 is a circuit diagram when a second input signal IN_2 is received in a first test circuit 110 according to example embodiments.

Referring to FIGS. 2 and 3, the first test circuit 110 may perform a package test or an EDS test. When the first input signal IN_1 is received, and the logic value of the selection signal Select_Sig is "1", the first test circuit 110 performs a package test, and when the second input signal IN_2 is input, and the logic value of the selection signal Select_Sig is "0", the first test circuit 110 performs an EDS test.

The first test circuit 110 according to example embodiments includes a first decompressor 111, a scan chain block 130, and/or a first compressor 112. In addition, the first test circuit 110 may be located or installed on the semiconductor chip 200, and the semiconductor chip 200 may be located or installed on the semiconductor package 300.

The first decompressor 111 decompresses the first input signal IN_1 and transmits the decompressed first input signal IN_1*a* to the scan chain block 130. When the decompressed first input signal IN_1*a* is received, a plurality of scan chains 130_*n* in the scan chain block 130 store information of the decompressed first input signal IN_1*a* and transmit the signal-processed first input signal IN_1*b* to the first compressor 112. When the signal-processed first input signal IN_1*b* is received, the first compressor 112 compresses the signals received from the scan chain block 130 and generates the first output signal OUT_1.

Referring to FIG. 2, in order to perform a package test, the first test circuit 110 receives a first input signal IN_1. For example, when the signal selection circuit 140 receives the first input signal IN_1 and the logic value of the selection signal is in a high state, the signal selection circuit 140 transmits the first input signal IN_1 to the first decompressor 111 of the first test circuit 110. When the first input signal IN_1 is received, the first decompressor 111 decompresses the first input signal IN_1 and transmits the decompressed first input signal IN_1*a* to the scan chain block 130. When the decompressed first input signal IN_1*a* is received, the scan chain block 130 processes the decompressed first input signal IN_1*a* and transmits the processed result to the first compressor 112. According to example embodiments, the processing of the first input signal IN_1 may include a process of detecting whether the semiconductor chip package is defective. When the first input signal IN_1*b* for which a predetermined or alternatively, desired processing has been completed is received, the first compressor 112 compresses the received signal and generates the first output signal OUT_1. The first output signal OUT_1 is transmitted to the output selection circuit 150. According to example embodiments, when the logic value of the selection signal Select_Sig is in the high state, the output selection circuit 150 transmits the first output signal OUT_1 to the first output pad 11. That is, when the first input signal IN_1 is input to the first test circuit 110, the first test circuit 110 performs a package test, wherein the first output signal OUT_1 may be a signal including package test result information.

Referring to FIG. 3, in order to perform an EDS test, the first test circuit 110 receives a second input signal IN_2. According to example embodiments, the second input signal IN_2 may be received through a plurality of input pads 20 including TEST IN 0, TEST IN 1, . . . , and TEST IN n–1.

For example, when the second input signal IN_2 is received, the first test circuit 110 may transmit the second input signal IN_2 to the first decompressor 111 of the first test circuit 110, regardless of the logic value of the selection signal. When the second input signal IN_2 is received, the first decompressor 111 decompresses the second input signal IN_2 and transmits the decompressed second input signal IN_2*a* to the scan chain block 130. When the decompressed second input signal IN_2*a* is received, the scan chains of the scan chain block 130 process the decompressed second input signal IN_2*a* and transmit the processed result to the first compressor 112. According to example embodiments, the processing of the second input signal IN_2 may include a process of detecting whether the semiconductor chip is defective. When the second input signal IN_2*b* for which a predetermined or alternatively, desired processing has been completed is received, the first compressor 112 compresses the received signal and transmits the second output signal OUT_2 to the second output pads 21. That is, when the second input signal IN_2 is input to the first test circuit 110, the first test circuit 110 performs an EDS test. According to example embodiments, the second output signal OUT_2 may be a signal including EDS test result information.

Figure 4:
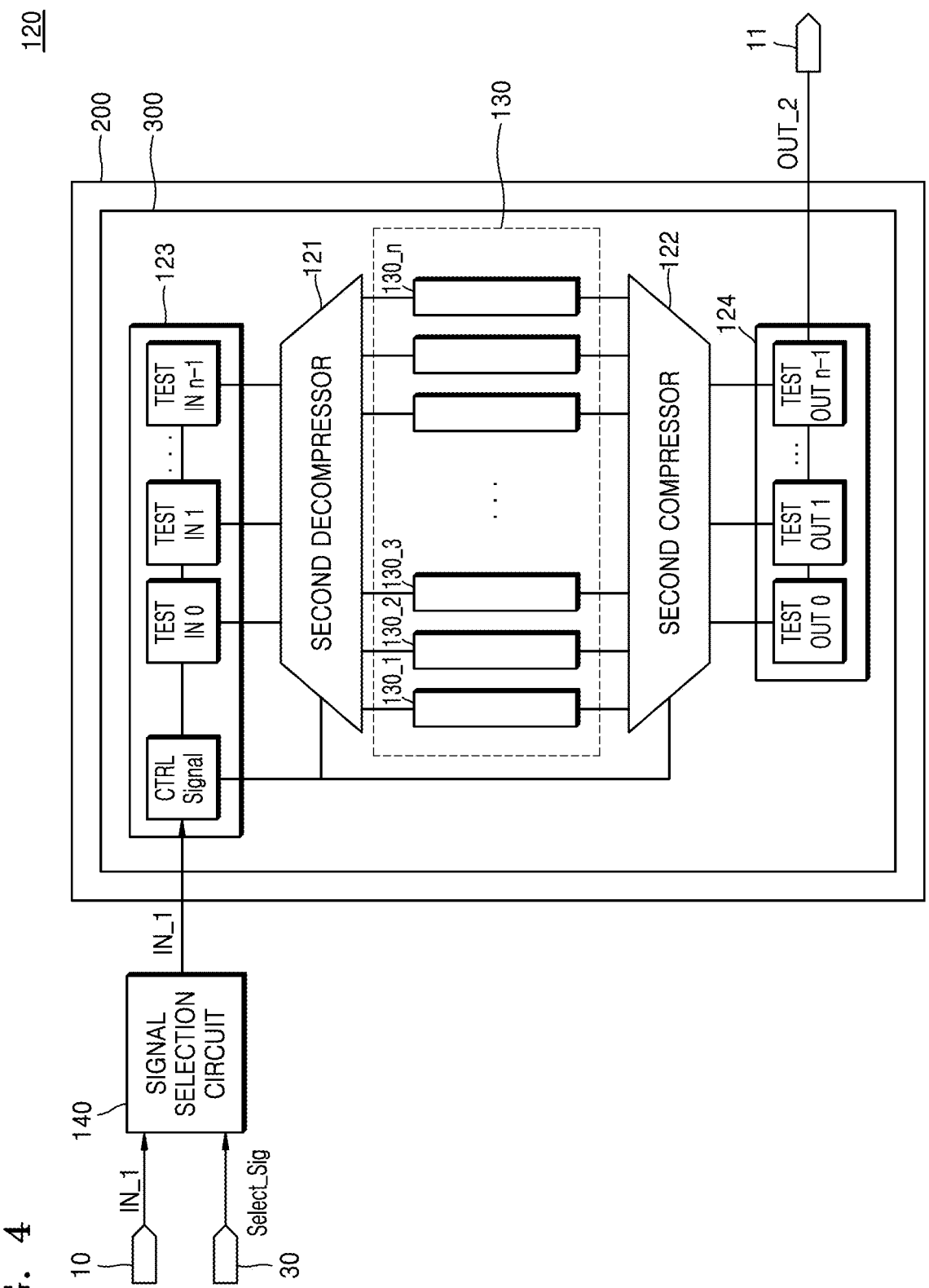
FIG. 4 is a circuit diagram of a second test circuit according to example embodiments.

FIG. 4 is a circuit diagram of a second test circuit 120 according to example embodiments.

Referring to FIG. 4, the second test circuit 120 may include a second decompressor 121, a scan chain block 130, and/or a second compressor 122, and/or a deserializer 123 including a plurality of input terminals TEST IN 0, TEST IN 1, . . . , and TEST IN n–1, in addition to a control signal terminal CTRL Signal, and an output pin block 124 including a plurality of output terminals TEST OUT 0, TEST OUT 1, . . . , and TEST OUT n–1.

The second test circuit 120 according to example embodiments receives the first input signal IN_1 to perform a package test. For example, when the signal selection circuit 140 receives the first input signal IN_1 and the logic value of the selection signal is in a low state, the signal selection circuit 140 transmits the first input signal IN_1 to the deserializer 123 of the second test circuit 120. The plurality of input terminals TEST IN 0, TEST IN 1, . . . , and TEST IN n–1 may be deserialized in the deserializer 123 and located or installed in the second test circuit 120 to thus disperse the first input signal IN_1, and transmit the dispersed first input signal IN_1*c* to the second decompressor 121. According to example embodiments, the deserializer 123 may control the parallelization process of the first input signal IN_1 and control the input speed of the first input signal IN_1 by generating a control signal CTRL Signal through the control signal terminal CTRL Signal.

When the dispersed first input signal IN_1*c* is received, the second decompressor 121 decompresses the dispersed first input signal IN_1*c* and transmits the decompressed first input signal IN_1*d* to the scan chain block 130. According to example embodiments, the scan chain block 130 may be shared with the first test circuit 110 described above. When the decompressed first input signal IN_1*d* is received, the scan chains of the scan chain block 130 process the decompressed first input signal IN_1*d* and transmit the processed result to the second compressor 122. According to example embodiments, the processing of the first input signal IN_1 may include a process of detecting whether the semiconductor chip package is defective. When the first input signal IN_1*e* for which a predetermined or alternatively, desired processing has been completed is received, the second compressor 122 compresses the received signal to generate a dispersed second output signal OUT_2' and transmits the dispersed second output signal OUT_2' to the serializer 124. The serializer 124 includes a plurality of output terminals TEST OUT 0, TEST OUT 1, . . . , TEST OUT n–1, and is serialized and located or installed in the second test circuit 120 to merge the dispersed second output signal OUT_2', and the merged second output signal OUT_2 may be transmitted to the output selection circuit as shown at FIG. 2.

When the second output signal OUT_2 is received in the output selection circuit 150 and the logic value of the selection signal Select_Sig is in a low state, the second output signal OUT_2 is transmitted to the first output pad 11.

That is, when the first input signal IN_1 is input to the second test circuit 120, the second test circuit 120 may perform a package test. According to example embodiments, the second output signal OUT_2 may be a signal including package test result information. In addition, the second test circuit 120 includes the input pin block 123 including a plurality of input terminals and the output pin block 124 including a plurality of output terminals, thereby increasing the compression rate of the first input signal IN_1 compared to the first test circuit 110 and performing a package test faster than the package test performed by the first test circuit 110.

Figure 5:
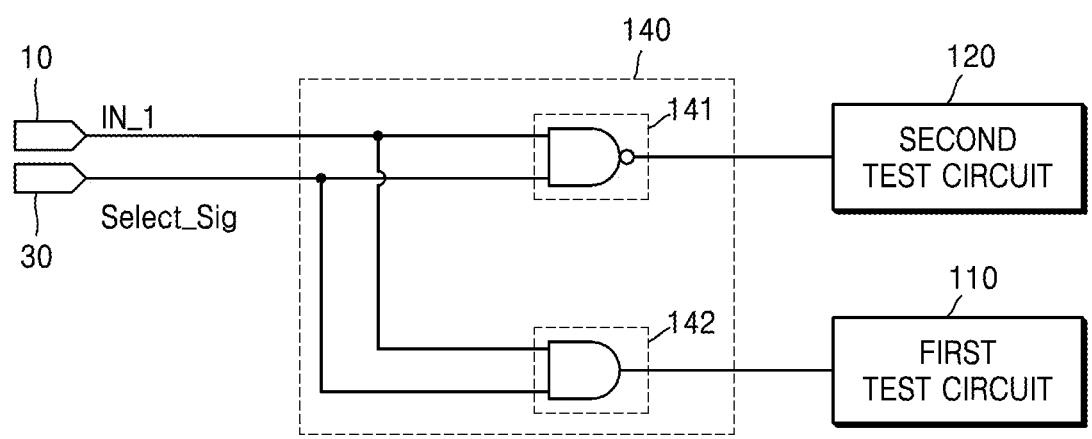
FIG. 5 illustrates a signal selection circuit according to example embodiments.

FIG. 5 illustrates a signal selection circuit 140 according to example embodiments.

Referring to FIG. 5, the signal selection circuit 140 may include a NAND gate 141 and/or an AND gate 142. In addition, each of the NAND gate 141 and the AND gate 142 may be connected to the first input pad 10 and the third input pad 30. In addition, the NAND gate 141 may be connected to the second test circuit 120, and the AND gate 142 may be connected to the first test circuit 110. However, the logic circuit present in the signal selection circuit 140 is not limited thereto, and may include other configurations that derive the result values described below.

For example, when the first input signal IN_1 is received and the logic value of the selection signal Select_Sig is in a high state, the signal selection circuit 140 may set the output of the AND gate 142 to high and transmit the first input signal IN_1 to the first test circuit 110. In addition, when the first input signal IN_1 is received and the logic value of the selection signal Select_Sig is in a low state, the signal selection circuit 140 may set the output of the NAND gate 141 to high and transmit the first input signal IN_1 to the second test circuit 120.

Figure 6:
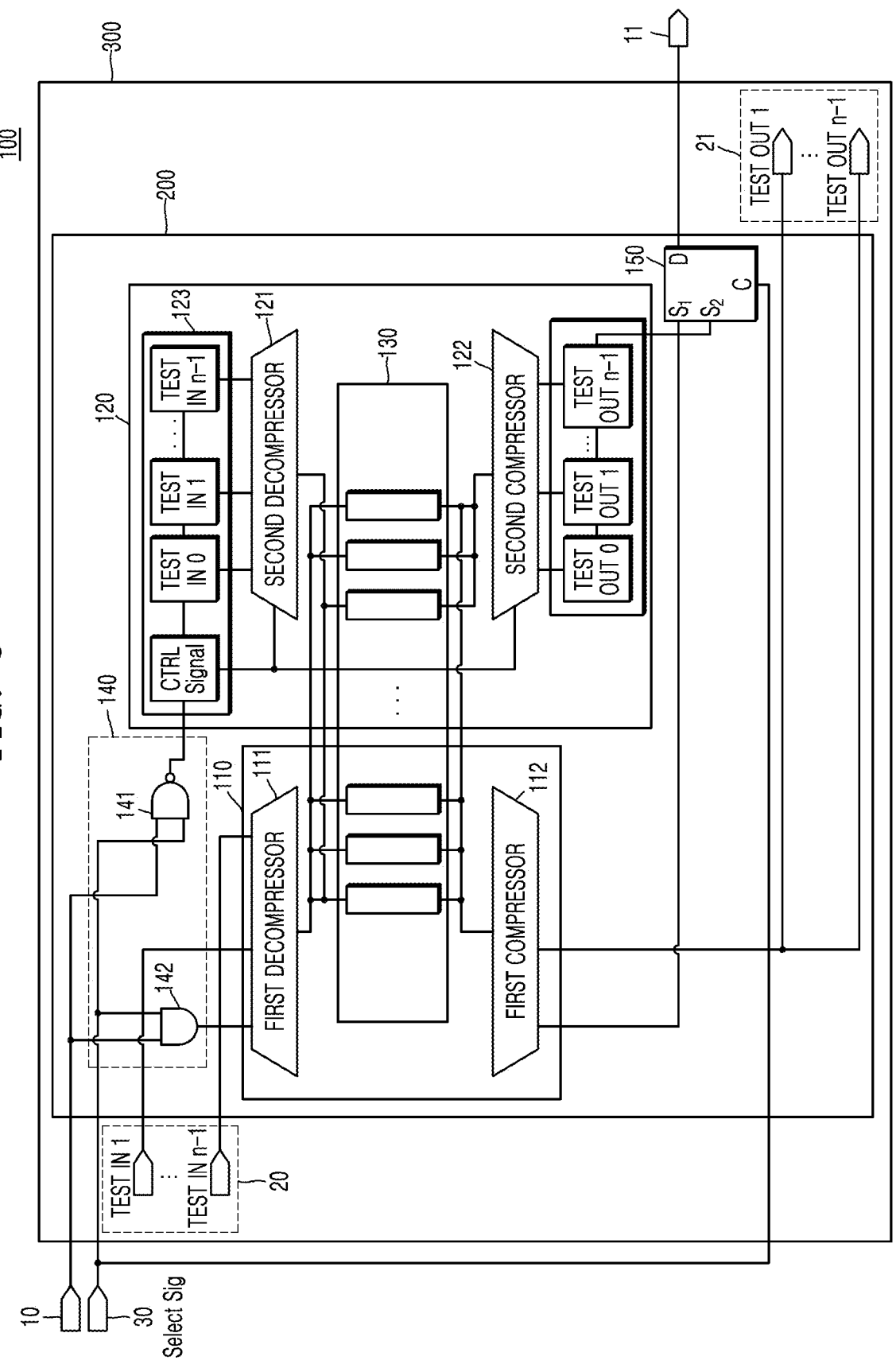
FIG. 6 is a circuit diagram of an integrated circuit package according to example embodiments.

FIG. 6 is a circuit diagram of an integrated circuit package 100 according to example embodiments.

Referring to FIG. 6, the integrated circuit package 100 may include a first test circuit 110 and a second test circuit 120, and the first test circuit 110 and the second test circuit 120 may share a scan chain block 130. In addition, the integrated circuit package 100 may be a multi-chip package. For example, the integrated circuit package 100 may include a semiconductor chip 200 in which an EDS test is performed or a semiconductor package 300 in which a package test is performed. However, as described later in FIG. 11, the number of example embodiments in which the integrated circuit package 100 may be exposed is not limited thereto, and a plurality of the integrated circuit packages may be exposed to test more semiconductor chips.

In addition, the first input pad 10, the first output pad 11, and the third input pad 30 may be physically balled out to the outside of the integrated circuit package 100. The second input pad 20 and the second output pad 21 may be exposed inside the integrated circuit package 100 and may be exposed outside a chip for performing the EDS test.

The scan chain block 130 may include a plurality of scan chains (not shown) and may be shared by the first test circuit 110 and the second test circuit 120. The scan chain block 130 stores information of the decompressed first input signal IN_1 or the decompressed second input signal IN_2 and enables the first compressor 112 and the second compressor 122 to efficiently generate an output signal.

The output selection circuit 150 may include a first terminal S1 receiving a first output signal OUT_1 and a second terminal S2 receiving a second output signal OUT_2, and a third terminal C receiving a selection signal Select_Sig. In addition, the output selection circuit 150 may be connected to the first output pad 11 through an output terminal D. As described above, the output selection circuit 150 determines which one of the first output signal OUT_1 and the second output signal OUT_2 to be transmitted to the first output pad 11.

For example, when the first output signal OUT_1 is input and the logic value of the selection signal Select_Sig is in a high state, the output selection circuit 150 may transmit the first output signal OUT_1 to the first output pad 11. In addition, when the second output signal OUT_2 is received and the logic value of the selection signal Select_Sig is in a low state, the output selection circuit 150 may transmit the second output signal OUT_2 to the first output pad 11.

Figure 7:
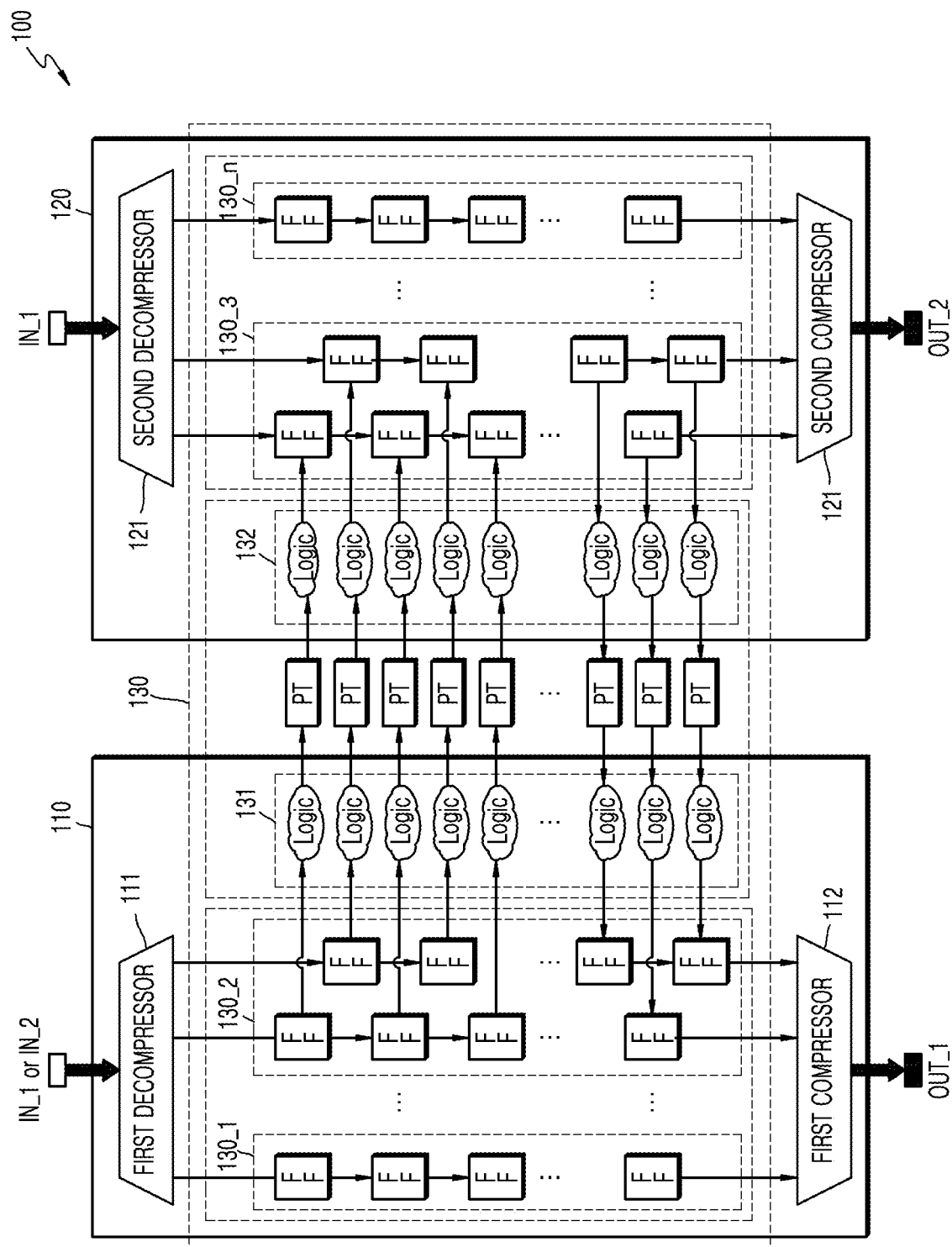
FIG. 7 illustrates a scan chain according to example embodiments.

FIG. 7 illustrates a scan chain block 130 according to example embodiments.

Referring to FIG. 7, the scan chain block 130 includes a plurality of scan chains 130_1, 130_2, 130_3, ..., and 130_n. In addition, the scan chain block 130 may include a plurality of logic blocks 131 and 132, and may be shared by the first test circuit 110 and the second test circuit 120 through a plurality of ports PTs. According to example embodiments, the logic blocks 131 and 132 and a plurality of pods PTs may constitute an interface circuit. In addition, the first scan chain 130_1, the second scan chain 130_2, the third scan chain 130_3, and the n-th scan chain 130_n may each include a plurality of flip-flops FFs.

Hereinafter, for convenience, scan chains provided in the scan chain block 130 are referred to as first scan chains 130_1, second scan chains 130_2, third scan chains 130_3, and n-th scan chains 130_n.

Each of the first scan chain 130_1 and the second scan chain 130_2 includes a plurality of flip-flops FFs. When a logic signal is input to the first scan chain 130_1 and the second scan chain 130_2, one flip-flop FF of each of the first scan chain 130_1 and the second scan chain 130_2 stores the input logic signal until the next logic signal is input thereto, and when the next logic signal is input to the first scan chain 130_1 and the second scan chain 130_2, the flip-flop FF stores the next input logic signal, and transfer the previous input logic signal to another flip-flop FF thereof. The first decompressor 111 may decompress the first input signal IN_1 and transmit the decompressed first input signal to the first scan chain 130_1 and the second scan chain 130_2. When the first input signal IN_1 is received, the first compressor 111 may generate the first output signal OUT_1 by compressing the output signals of the first scan chain 130_1 and the second scan chain 130_2 and outputting the compressed result. In addition, the logic blocks 131 and 132 and the plurality of ports PTs may be connected to the first decompressor 111 and the first compressor 112 of the first test circuit 110 to be tested through tests of the third scan chain 130_3 and the n-th scan chain 130_n.

According to example embodiments, the first test circuit 110 and the second test circuit 120 may perform a test operation separately or may simultaneously perform a test operation.

Figure 8:
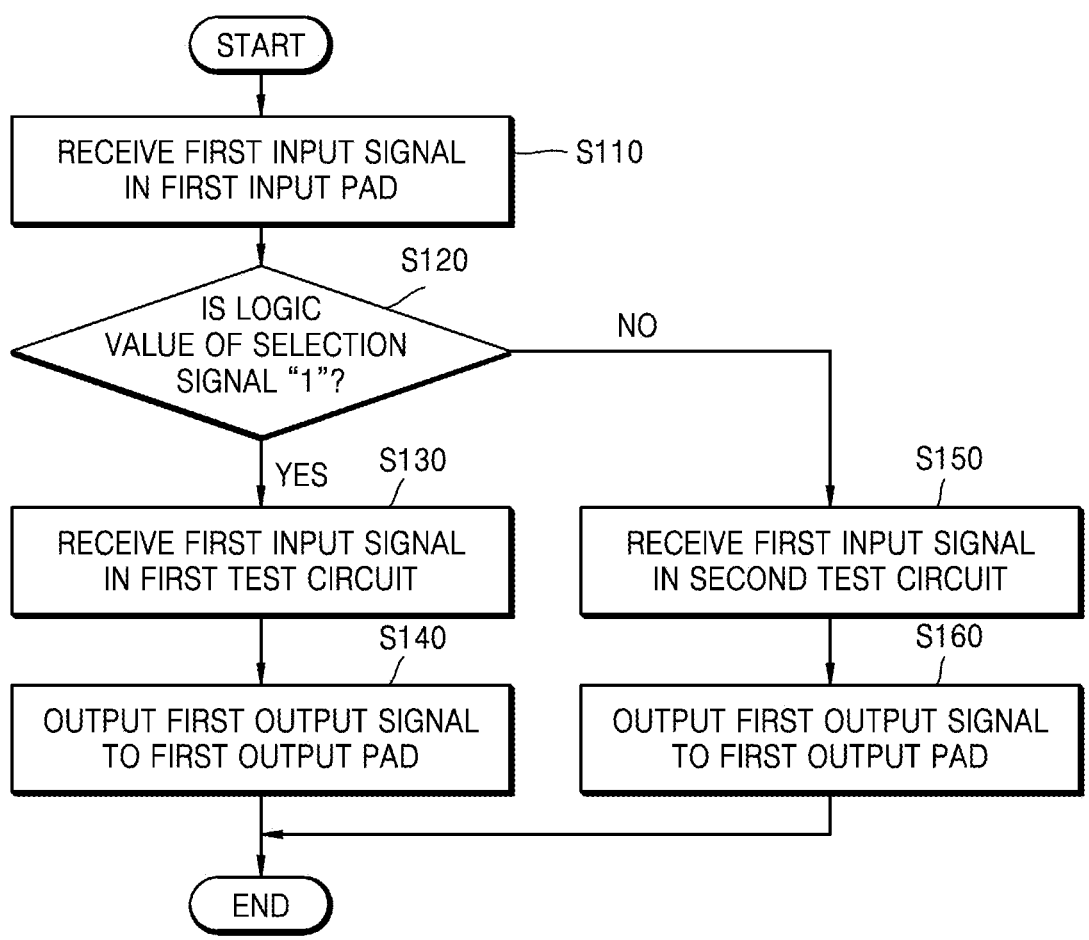
FIG. 8 is a flowchart illustrating an operating method of an integrated circuit package according to example embodiments.

FIG. 8 is a flowchart illustrating an operating method of an integrated circuit package 100 according to example embodiments.

Referring to FIG. 8, a first input signal IN_1 may be received by the first input pad 10 to perform a package test (S110). As described above, the first input pad 10 may be balled out outside the integrated circuit package. According to example embodiments, the first input signal IN_1 is defined as a signal for a package test.

When the first input signal IN_1 is received, the signal selection circuit 140 determines whether the logic value of the selection signal Select_Sig is "1" (S120). According to example embodiments, the meaning that the logic value is "1" means that the logic value is in a high state, and the meaning that the logic value is "0" means that the logic value is in a low state.

When it is determined that the logic value of the selection signal is "1", the signal selection circuit 140 may transmit the first input signal IN_1 to the first test circuit 110, and the first test circuit 110 may receive the first input signal IN_1 through the first decompressor 111 (S130).

When the first input signal IN_1 is received by the first test circuit 110, the first test circuit 110 processes the first input signal IN_1 and outputs the first output signal OUT_1 to the first output pad 11 (S140). According to example embodiments, the first output pad 11 may be balled out outside the integrated circuit package. In addition, the first test circuit 110 may process the first input signal IN_1 by decompressing the first input signal IN_1 and providing the decompressed first input signal IN_1a to the plurality of scan chains 130_1, 130_2, . . . , and 130_n, and then compressing the received decompressed first input signal IN_1a again.

When it is determined that the logic value of the selection signal is "0", the signal selection circuit 140 may transmit the first input signal IN_1 to the second test circuit 120, and the second test circuit 120 may receive the first input signal IN_1 through the second decompressor 121 (S150). According to example embodiments, the first input signal IN_1 may be input in parallel through the input pin block 123 including a plurality of input terminals.

When the first input signal IN_1 is received by the second test circuit 120, the second test circuit 120 processes the first input signal IN_1 and the second output signal OUT_2 is output to the first output pad 11 (S160). According to example embodiments, the second output signal OUT_2 may be transmitted to the first output pad 111 through the serializer 124 exposed inside the integrated circuit package and outside the multi-chip. Since the serializer 124 includes a plurality of serialized output terminals, the divided second output signal OUT_2' may be merged into the second output signal OUT_2. In addition, the second test circuit 120 may process the first input signal IN_1 through a process of decompressing the first input signal IN_1, providing the decompressed first input signal IN_1d through a plurality of scan chains 130_1, 130_2, . . . , and 130_n, and compressing the decompressed first input signal IN_1d again. According to example embodiments, the first output signal OUT_1 may include package test result information of the semiconductor chip.

Through the above-described process, the integrated circuit package 100 may perform a test on whether the semiconductor package chip is defective in two modes. When performing a package test by the first test circuit 110, an EDS test may also be performed by the first test circuit 110 so that spatial efficiency exists, and when a package test is performed by the second test circuit 120, the compression rate of the first input signal IN_1 may be increased, and thus efficiency exists in terms of signal processing speed.

Figure 9:
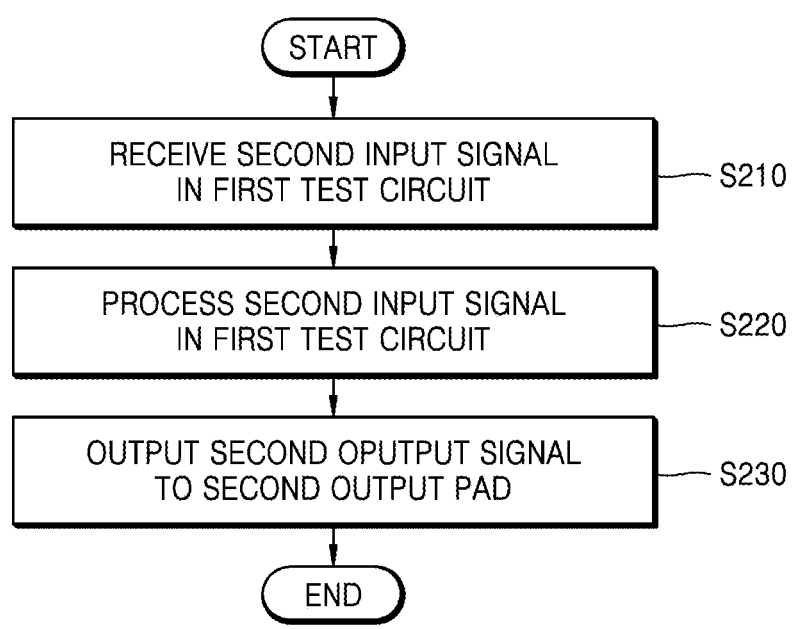
FIG. 9 is a flowchart illustrating a case in which a second input signal is received in a first test circuit in an integrated circuit package according to example embodiments.

FIG. 9 is a flowchart illustrating a case in which a second input signal IN_2 is received in a first test circuit 100 in an integrated circuit package 100 according to example embodiments.

Referring to FIG. 9, a second input signal IN_2 is received by the first test circuit 110 to perform an EDS test on a semiconductor chip (S210). According to example embodiments, the second input signal IN_2 is defined as a signal for performing an EDS test.

The second input signal IN_2 may be received through the second input pad 20. As described above, a plurality of second input pads 20 may exist. In addition, unlike the first input signal IN_1, the second input signal IN_2 may be directly input to the first test circuit 110 without passing through the signal selection circuit 140.

When the second input signal IN_2 is received, the first test circuit 110 may process the second input signal IN_2 (S220). For example, the first test circuit 110 may process the second input signal IN_2 by decompressing the second input signal IN_2, providing the decompressed second input signal IN_2a to a plurality of scan chains 130_1, 130_2, . . . , and 130_n, and compressing the decompressed second input signal IN_2a again.

When the processing of the second input signal IN_2 is completed, the first test circuit 110 outputs the second output signal OUT_2 to the second output pad 21 (S230). The second output signal OUT_2 may include EDS test result information of the semiconductor chip.

Figure 10:
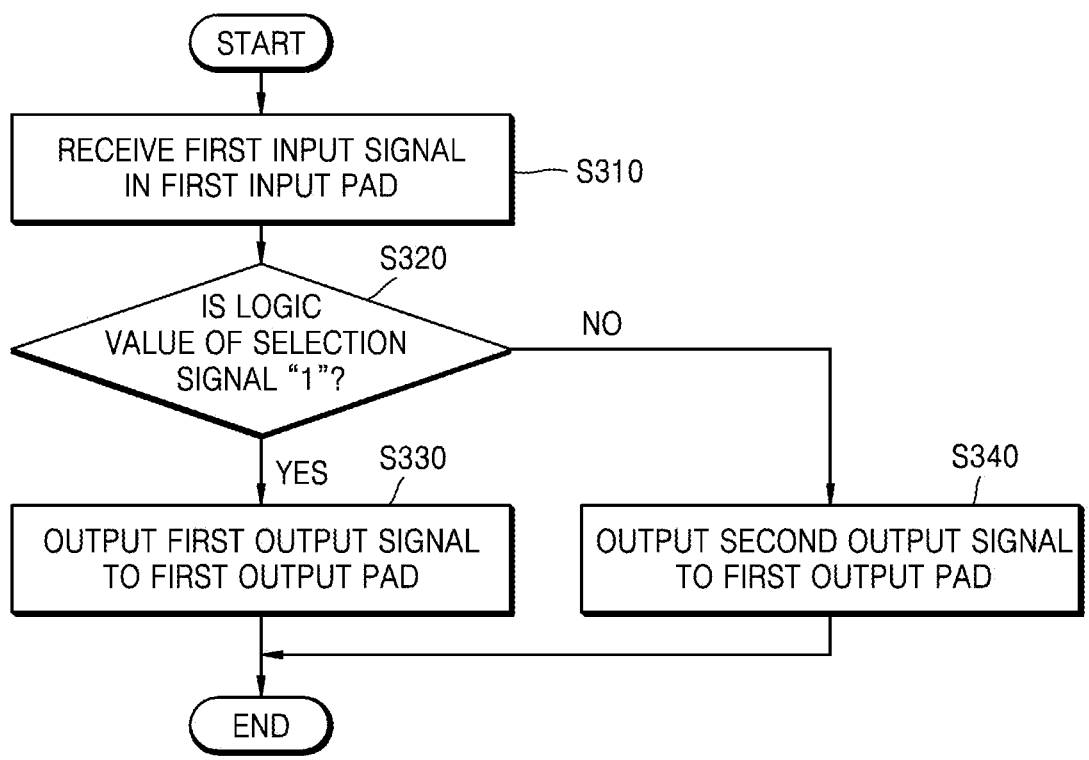
FIG. 10 is a flowchart illustrating a process of generating an output signal in an integrated circuit package according to example embodiments.

FIG. 10 is a flowchart illustrating a process of generating an output signal in an integrated circuit package 100 according to example embodiments.

Referring to FIG. 10, when a package test is completed in the first test circuit 110 or the second test circuit 120, a first output signal OUT_1 and a second output signal OUT_2 may be received in the output selection circuit 150 (S310).

When the first output signal OUT_1 and the second output signal OUT_2 are received, the output selection circuit 150 determines whether the logic value of the selection signal Select_Sig is "1" (S320). According to example embodiments, the meaning that the logic value is "1" means that the logic value is in a high state, and the meaning that the logic value is "0" means that the logic value is in a low state.

When the logic value of the selection signal is "1", the output selection circuit 150 may output the first output signal OUT_1 to the first output pad 11 (S330). However, when the logic value of the selection signal is "0", the output selection circuit 150 may output the second output signal OUT_2 to the first output pad 11 (S340).

Figure 11:
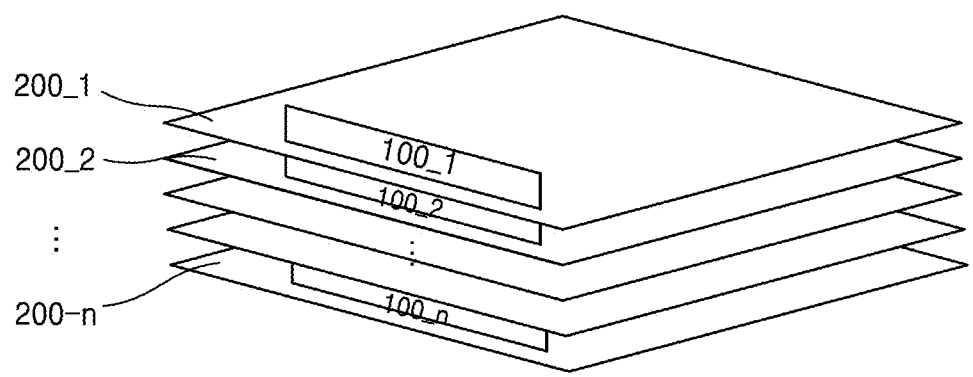
FIG. 11 is a block diagram illustrating a case in which a plurality of integrated circuit packages are exposed according to example embodiments.

FIG. 11 is a block diagram illustrating a case in which a plurality of integrated circuit packages 100 are exposed according to example embodiments.

Referring to FIG. 11, a plurality of integrated circuit packages 100 may be exposed according to the number of semiconductor chips to be tested. For example, when a plurality of semiconductor chips 200_1, 200_2, . . . , and 200n to be tested are exposed, a plurality of integrated circuit packages 100_1, 100_2, . . . , and 100n may be exposed on at least one chip, respectively.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to example embodiments thereof, it will be understood that various changes in form and details may be made therein without departing from the spirit and scope of the following claims.

What is claimed is:

1. An integrated circuit package for scan testing a semiconductor chip, the integrated circuit package comprising:
    at least one first input pad configured to receive a first input signal;
    at least one chip connected to the at least one first input pad; and
    at least one first output pad configured to receive a first output signal generated from the at least one chip, wherein
    each of the at least one chip comprises
    at least one second input pad configured to receive a second input signal;
    a plurality of scan chains;
    a first test circuit and a second test circuit sharing the plurality of scan chains; and
    at least one second output pad configured to receive a second output signal from the first test circuit, wherein
    the integrated circuit package comprises
    a signal selection circuit configured to receive a selection signal and determine whether the first input signal is used in the first test circuit or the second test circuit, based on the selection signal.

2. The integrated circuit package of claim 1, wherein
    the signal selection circuit further comprises a third input pad configured to receive the selection signal, and
    the signal selection circuit is configured to selectively provide the first input signal to the second test circuit based on the selection signal.

3. The integrated circuit package of claim 2, wherein the signal selection circuit is configured to selectively provide the first input signal to the first test circuit based on the selection signal.

4. The integrated circuit package of claim 2, wherein each of the at least one chip further comprises an output selection circuit configured to receive the first output signal and the second output signal.

5. The integrated circuit package of claim 4, wherein, when the first input signal is input to the first test circuit, the output selection circuit outputs the first output signal to the first output pad.

6. The integrated circuit package of claim 4, wherein, when the second input signal is input to the first test circuit, the first test circuit is configured to output the first output signal to the second output pad.

7. The integrated circuit package of claim 4, wherein, when the first input signal is input to the second test circuit, the output selection circuit is configured to output the second output signal to the first output pad.

8. The integrated circuit package of claim 1, wherein
    the first input pad and the first output pad are exposed to outside of the integrated circuit package, and
    the second input pad and the second output pad are exposed to a plurality of terminals outside the at least one chip and inside the integrated circuit package.

9. An operating method of an integrated circuit package for scan testing a semiconductor chip, the operating method comprising:
    receiving a first input signal through a first input pad;
    receiving a selection signal by a selection signal circuit;
    determining, based on the selection signal, whether the first input signal is provided to one of a first test circuit and a second test circuit of at least one chip exposed to the semiconductor chip; and
    outputting a first output signal generated by the first test circuit or a second output signal generated by the second test circuit, wherein
    the outputting the first output signal or the second output signal comprises,
    when the first input signal is input to the first test circuit, outputting the first output signal to a first output pad exposed to outside of the semiconductor chip.

10. The operating method of claim 9, further comprising:
    inputting a second input signal to a second input pad exposed to outside of the first test circuit and inside of the semiconductor chip.

11. The operating method of claim 9, wherein the determining of whether the first input signal is provided to one of the first test circuit and the second test circuit comprises providing the first input signal to the second test circuit when a logic value of the selection signal is in a low state.

12. The operating method of claim 9, wherein the determining of whether the first input signal is provided to one of the first test circuit and the second test circuit comprises providing the first input signal to the first test circuit when a logic value of the selection signal is in a high state.

13. The operating method of claim 9, further comprising:
    determining whether to output the first output signal and the second output signal.

14. The operating method of claim 13, wherein the outputting the first output signal or the second output signal comprises outputting the second output signal to the first output pad when the first input signal is input to the second test circuit.

15. An integrated circuit for scan testing a semiconductor chip, the integrated circuit comprising:
    a first test circuit configured to receive one of a first input signal and a second input signal, and generate a first output signal;
    a second test circuit configured to receive the first input signal and generate a second output signal, wherein
    the first test circuit comprises
        a first decompressor configured to receive the first input signal or the second input signal,
        a first compressor configured to generate the first output signal, and
        a scan chain configured to connect the first decompressor with the first compressor, and
    the second test circuit comprises
        a second decompressor configured to receive the first input signal,
        a second compressor configured to generate the second output signal, and
        the scan chain configured to connect the second decompressor with the second compressor,
    a signal selection circuit configured to determine whether the first input signal or the second input signal is used in the first test circuit, based on a selection signal, and
    an output selection circuit configured to receive the first output signal from the first compressor and the second output signal from the second compressor, and output one of the first output signal and the second output signal based on the selection signal.

16. The integrated circuit of claim 15, wherein, when a logic value of the selection signal is in a high state and the first input signal is received, the output selection circuit is configured to output the first output signal to a first output pad exposed to outside of the integrated circuit.

17. The integrated circuit of claim 15, wherein, when a logic value of the selection signal is in a low state, the signal selection circuit is configured to provide the first input signal to the second test circuit.

18. The integrated circuit of claim 15, wherein, when a logic value of the selection signal is in a low state and the first input signal is received, the second test circuit is configured to output the second output signal to a first output pad exposed to outside of the integrated circuit.

19. The integrated circuit of claim 15, wherein, when the second input signal is received by the first test circuit, the first test circuit is configured to output the first output signal to a second output pad exposed to outside of the integrated circuit.

\* \* \* \* \*